United States Patent [19]
Muenzel et al.

[11] Patent Number: 6,140,709
[45] Date of Patent: Oct. 31, 2000

[54] BONDING PAD STRUCTURE AND METHOD FOR MANUFACTURING THE BONDING PAD STRUCTURE

[75] Inventors: Horst Muenzel, Reutlingen; Michael Offenberg, Kirchentellinsfurt; Udo Bischof, Wannweil; Eckhard Graf, Gomaringen; Markus Lutz, Reutlingen, all of Germany

[73] Assignee: Robert Bosch GmbH, Stuttgart, Germany

[21] Appl. No.: 09/306,181

[22] Filed: May 6, 1999

[30] Foreign Application Priority Data

May 9, 1998 [DE] Germany .............................. 198 20 816

[51] Int. Cl.[7] ........................... H01L 23/48; H01L 25/52; H01L 29/40
[52] U.S. Cl. ............................................ 257/781; 257/786
[58] Field of Search .................................. 257/780, 781, 257/782, 786, 776; 438/612, 613, 614

[56] References Cited

U.S. PATENT DOCUMENTS

| | | |
|---|---|---|
| 5,814,893 | 9/1998 | Hsu et al. . |
| 5,838,054 | 11/1998 | Kwasnick et al. . |
| 5,925,931 | 7/1999 | Yamamoto . |
| 6,066,877 | 5/2000 | Williams et al. . |

*Primary Examiner*—Sheila V. Clark
*Attorney, Agent, or Firm*—Kenyon & Kenyon

[57] ABSTRACT

A bonding pad structure, in particular for a micromechanical sensor, includes a substrate, an electrically insulating sacrificial layer provided on the substrate, a patterned conductor path layer buried in the sacrificial layer, a contact hole provided in the sacrificial layer, and a bonding pad base, composed of an electrically conductive material. The bonding pad base has a first region extending over the sacrificial layer, and a second layer in contact with the conductor path region and extending through the contact hole. A protective layer is provided at least temporarily on the sacrificial layer in a specific region beneath and around the bonding pad base to prevent underetching of the sacrificial layer beneath the bonding pad base during etching of the sacrificial layer in such a way that the substrate and/or the conductor path is exposed.

24 Claims, 2 Drawing Sheets

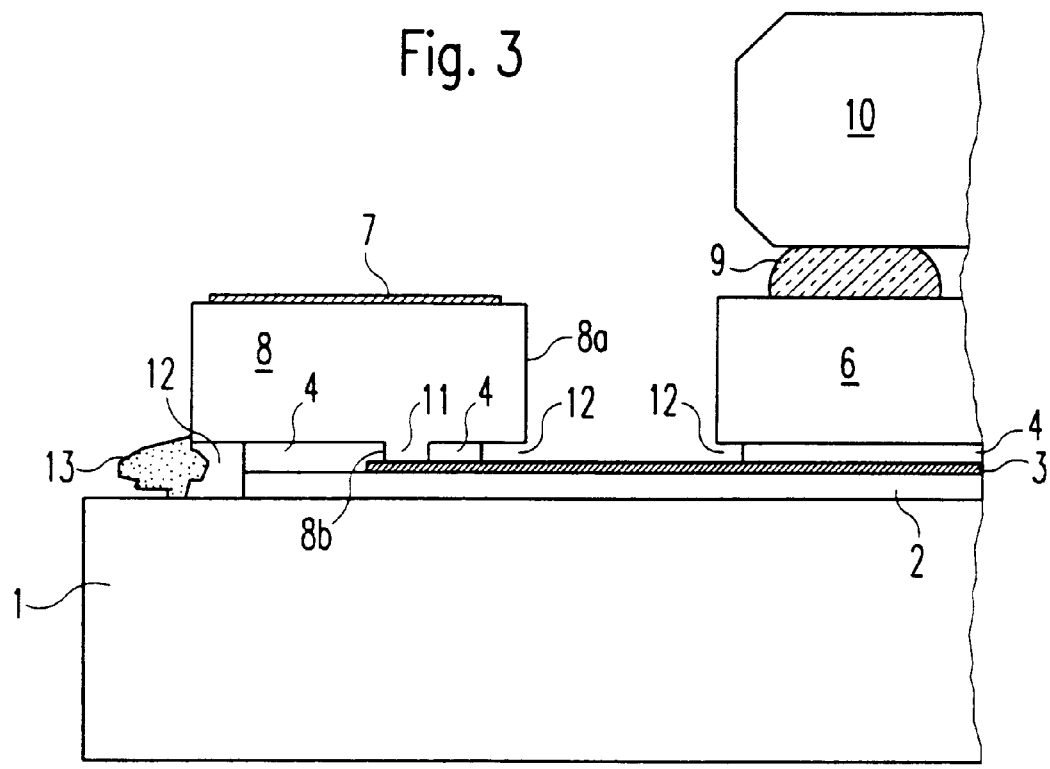

BONDING PAD STRUCTURE AND METHOD FOR MANUFACTURING THE BONDING PAD STRUCTURE

FIELD OF THE INVENTION

The present invention relates to a bonding pad structure, and in particular to a bonding pad structure for a micromechanical sensor. The bonding pad structure has a substrate, an electrically insulating sacrificial layer provided on the substrate, a patterned conductor path layer buried in the sacrificial layer, a contact hole provided in the sacrificial layer, and a bonding pad base composed of an electrically conductive material. The bonding pad base has a first region extending over the sacrificial layer, and a second layer in contact with the conductor path region and extending through the contact hole. The present invention also relates to a method for manufacturing the bonding pad structure.

Although applicable to any bonding pad structures, the present invention will be explained with reference to a bonding pad structure of a micromechanical acceleration sensor.

BACKGROUND INFORMATION

FIGS. 2 and 3 show a substrate 2 having a silicon structure, a lower oxide 2, a buried conductor path 3 composed of polysilicon, an upper oxide 4, a sensor base 6 composed of epitaxial polysilicon, a bonding pad 7 composed of aluminum, a bonding pad base 8 composed of epitaxial polysilicon having a first region 8a and a second region 8b, a sealing glass 9, a silicon protective cap 10, a contact hole 11, an underetched region 12, dirt particles 13, an oscillator 20, a G-sensor 30 having a comb structure, and a silicon wafer 100.

The micromechanical acceleration sensor constructed in this manner uses this conventional bonding pad structure to pass an electrical connection from, for example, an analog sensor structure provided under silicon protective cap 10, through under sensor base 6 (while guaranteeing hermetic sealing), into the vicinity of the sensor, and to make it bondable there.

As shown in FIG. 3, in the case of the usual bonding pad structure, an underetching of the bonding pad base 8 occurs in region 12 during etching of the first and second oxide layers, which serve at the same time as sacrificial layers for the comb structure of G-sensor 30. Dirt particles 13, such as those formed in particular during sawing in the form of sawing slurry, can become lodged there and can result in electrical short circuits between bonding pad base 8 and substrate 1, or between bonding pad base 8 and conductor path layer 3.

An object of the present invention is to prevent such short circuits in a simple manner.

A first approach toward preventing underetching of the bonding pads provides for covering the trenches around the bonding pads with negative resist during sacrificial oxide etching.

The fact that this is difficult in terms of process technology with step heights of more than approximately 10 μm, and is not even possible with all sensor structures, is a disadvantage of the first above-described approach. In addition, the negative resist must be removed immediately after HF gas-phase etching of the sacrificial layer, since it soaks up HF and can then no longer prevent underetching. In addition, complete removal of the resist in the trenches is complex, and even minor residues can cause the comb structures to stick.

SUMMARY OF THE INVENTION

A bonding pad structure according to the present invention, and the corresponding manufacturing method, as compared to the known solution, provide an advantage that complete underetching of the sacrificial layer beneath the bonding pad base no longer occurs, and that the danger of short circuits to exposed conductor paths around the bonding pad base, or other short circuits (for example to the substrate), can be avoided in a simple manner.

The present invention provides, on the sacrificial layer and in a specific region beneath and around the bonding pad base, a protective layer to at least temporarily prevent underetching of the sacrificial layer beneath the bonding pad base.

According to one embodiment of the present invention, the protective layer is provided on the sacrificial layer substantially in the entire region beneath the bonding pad base and to a specific distance around the entire bonding pad base. This yields the advantage that underetching does not occur at any point, not even where it might possibly not have a disruptive effect, and thus provides a great mechanical stability.

According to another embodiment of the present invention, the sacrificial layer has a first sacrificial layer and a second sacrificial layer thereabove, between which the conductor path layer is embedded.

According to another embodiment of the present invention, a sensor base is provided in the vicinity of the bonding pad base on the sacrificial layer, at least one conductor path of the buried patterned conductor path layer extending between the bonding pad base and the sensor base and therebeneath.

According to another embodiment of the present invention, the protective layer is provided on the sacrificial layer in a specific region beneath and around the sensor base. This feature makes it possible to prevent underetching of the sensor base and short-circuiting between sensor base and conductor path.

According to another embodiment of the present invention, the protective layer is provided on the sacrificial layer in a manner covering the entire conductor path of the buried patterned conductor path layer between the bonding pad base and the sensor base. The conductor can be protected at the top in continuously covering fashion.

According to another embodiment of the present invention, the protective layer is electrically insulating and is resistant to the etching medium used to etch the sacrificial layer. It is further advantageous for the protective layer to be resistant to trenching of the material of the bonding pad base, e.g., polysilicon. These features on the one hand offer optimum protection and on the other hand guarantee that the bonding pad structure, optionally together with a sensor structure, can be easily manufactured.

According to another embodiment of the present invention, the substrate is a silicon substrate, possibly also an SOI substrate, and the sacrificial layer is composed of silicon oxide.

According to another embodiment of the present invention, the protective layer has a layer composed of nitride and/or undoped intrinsic polysilicon and/or doped oxide. Although doped oxide is also etched during sacrificial layer etching, it is sufficient if the underetching does not exceed a specific extent.

According to another embodiment of the present invention, the protective layer has a double layer made of nitride and undoped intrinsic polysilicon, preferably a lower nitride layer 100–500 nm thick and an upper polysilicon layer 20–100 nm thick. Many nitrides are resistant to liquid HF but not to HF vapor. The nitride layer can be stabilized or sealed by way of the thin polysilicon layer. The polysilicon can be removed by argon sputtering or by using wet-chemical etching after the sensor has been capped, if the insulating properties of the polysilicon between bonding pad base and sensor base are not sufficient.

According to another embodiment of the present invention, the protective layer has a further layer of (possibly doped) silicon oxide. Since polysilicon is not selective, and nitride not particularly selective, with respect to polysilicon during trenching of the pad structure, a further thin oxide layer of this kind can be applied. Although this layer is etched during sacrificial layer etching, no possibility of short-circuiting is created, since all critical electrodes remain covered.

According to another embodiment of the present invention, a metallic bonding pad, which preferably is composed of aluminum or an aluminum alloy, is provided on the bonding pad base.

BRIEF DESCRIPTION OF THE DRAWINGS

FIG. 3 shows an enlarged illustration of the conventional bonding pad structure illustrated in FIG. 2.

DETAILED DESCRIPTION

Figure 1:
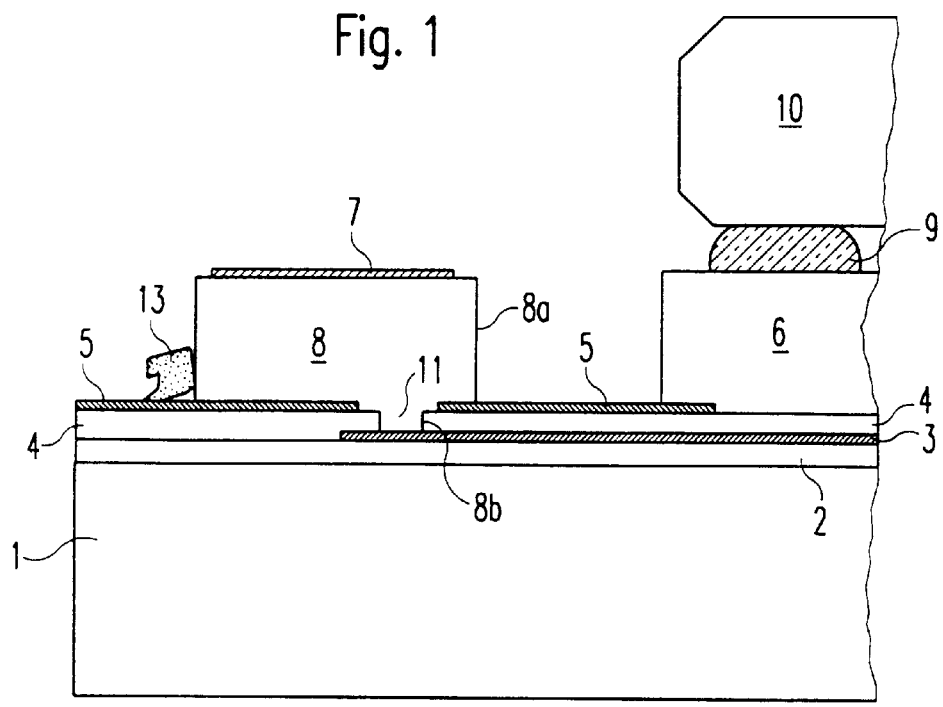
FIG. 1 shows an exemplary embodiment of a bonding pad structure according to the present invention, which is applied to a micromechanical acceleration sensor.

FIG. 1 shows an embodiment of the bonding pad structure according to the present invention applied to a micromechanical rotation rate sensor.

The bonding pad structure depicted in FIG. 1 for a micromechanical rotation rate sensor includes substrate 1, the electrically insulating sacrificial layer 2, 4 provided on substrate 1, the patterned conductor path layer 3 buried in sacrificial layer 2, 4, a contact hole 11 provided in sacrificial layer 2, 4, and a bonding pad base 8 composed of an electrically conductive material. Metallic bonding pad 7, composed of aluminum, is provided on bonding pad base 8.

The bonding pad base has first region 8a extending over sacrificial layer 2, 4, and second region 8b extending through contact hole 11 and contacting conductor path layer 3.

Sacrificial layer 2, 4 includes a first sacrificial layer 2 and a second sacrificial layer 4 thereabove, between which conductor path layer 3 is embedded. Substrate 1 is a silicon substrate 1, and sacrificial layers 2, 4 are made of silicon oxide.

In FIG. 1, element 5 identifies, in addition to the components indicated in conjunction with FIG. 3, a protective layer which is provided on sacrificial layer 2, 4 in a specific region beneath and around bonding pad base 8 in order to prevent underetching of sacrificial layer 2, 4 beneath bonding pad base 8. Protective layer 5 is provided on sacrificial layer 2, 4 substantially in the entire region beneath bonding pad base 8 and to a specific distance around the entire bonding pad base 8.

In the vicinity of bonding pad base 8, sensor base 6 is provided on sacrificial layer 2, 4. A conductor path of the buried patterned conductor path layer 3 runs between bonding pad base 8 and sensor base 6 and therebeneath. Protective layer 5 is also provided on sacrificial layer 2, 4 in a specific region beneath and around sensor base 6. In particular, protective layer 5 is provided on sacrificial layer 2, 4 in a manner covering the entire conductor path of the buried patterned conductor path layer 3 between bonding pad base 8 and sensor base 6.

In this exemplary embodiment, protective layer 5 is a double layer made of nitride and undoped intrinsic polysilicon. The lower nitride layer has a thickness of 100–500 nm, and the upper polysilicon layer has a thickness of 20–100 nm.

Because of protective layer 5, the electrically conductive dirt particle 13 shown in FIG. 1 can no longer create a short circuit.

The method for manufacturing the bonding pad structure as described in the above exemplary embodiment is described in more detail below.

Sacrificial layer 2, 4, with the patterned conductor path layer 3 buried therein, is first form on the prepared silicon substrate 1.

This is done by oxidizing substrate 1 to form first oxide layer 2, and then depositing and patterning conductor path layer 3 on first oxide layer 2. This is followed by deposition of second oxide layer 4 on patterned conductor path layer 3 and the surrounding first oxide layer 2.

In the following step, deposition and patterning of protective layer 5, i.e., the double layer of nitride and undoped intrinsic polysilicon, is accomplished. Protective region 5 is completely removed in the sensor region inside silicon protective cap 10 that is to be applied later, and in the region of contact hole 11.

This is followed by formation of the contact hole and formation of bonding pad base 8 in contact hole 11 in a conventional manner, e.g., by etching the contact hole, depositing an epitaxial polysilicon layer, depositing and patterning a bonding pad metal layer, and patterning the epitaxial polysilicon layer to form bonding pad base 11. In this context, a polysilicon layer deposited in a manner other than by epitaxy can also be used.

Figure 2:
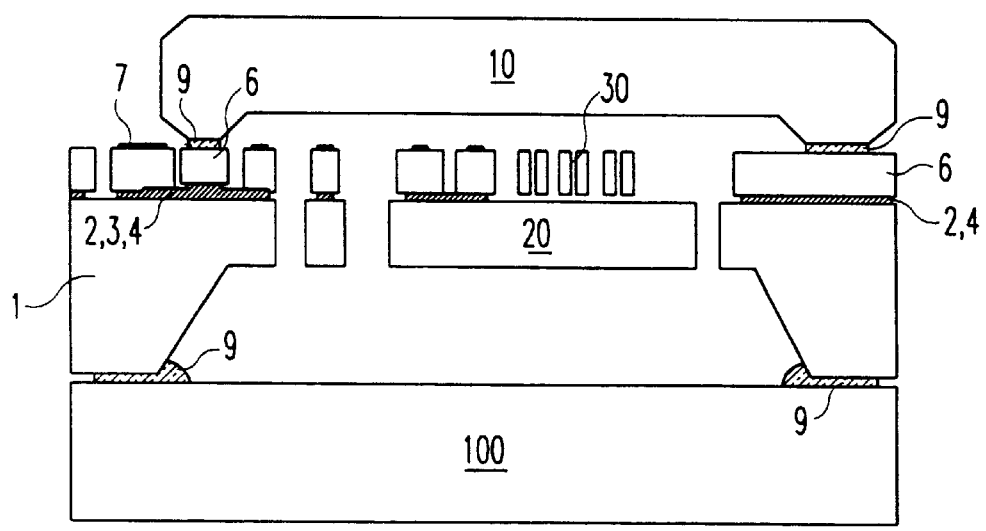
FIG. 2 shows a micromechanical rotation rate sensor having a conventional bonding pad structure.

During patterning of the epitaxial polysilicon layer, sensor comb structure 30 and sensor base structure 6 (shown in FIG. 2) are formed simultaneously with bonding pad base 8.

Lastly, etching of sacrificial layer 2, 4 is accomplished, thus rendering sensor comb structure 30 freely suspended with the exception of the anchoring region; along with application of sensor cap 10 on sensor base structure 6.

Neither bonding pad base 8 nor sensor base 6 can be underetched to expose electrical contacts or conductors.

Although the present invention has been described above with reference to a preferred exemplary embodiment, it is not limited thereto, and can be modified in numerous ways.

For example, the bonding pad structure according to the present invention can be applied not only to micromechanical acceleration sensors, but also to any micromechanical or microelectronic components.

Although, in the above exemplary embodiment, the protective layer has a double layer made of nitride and polysilicon, in some circumstances a layer made of nitride or a layer made of undoped intrinsic polysilicon may also suffice.

The present invention is also usable not only for silicon components, but also for components made of other micromechanical materials.

What is claimed is:

1. A bonding pad structure, comprising:

a substrate;

an electrically insulating sacrificial layer situated on the substrate and including a contact hole;

a patterned conductor path layer buried in the electrically insulating sacrificial layer;

a bonding pad base composed of an electrically conductive material, the bonding pad base including a first region which extends over the electrically insulating sacrificial layer and a second region which extends through the contact hole, the second region contacting the patterned conductor path layer; and a protective layer at least temporarily provided on a particular region of the electrically insulating sacrificial layer, the particular region being beneath the bonding pad base and around the bonding pad base, the protective layer preventing the electrically insulating sacrificial layer from being underetched beneath the bonding pad base when the electrically insulating sacrificial layer is being etched such that at least one of the substrate and the patterned conductor path layer is exposed.

2. The bonding pad structure according to claim 1, wherein the particular region is substantially an entire region beneath the bonding pad base, the particular region extending for a predetermined distance around the bonding pad base.

3. The bonding pad structure according to claim 1, wherein the electrically insulating sacrificial layer has a first layer and a second layer above the first layer, and wherein the patterned conductor layer is embedded between the first layer and the second layer.

4. The bonding pad structure according to claim 1, further comprising:

a sensor base provided on the electrically insulating sacrificial layer in a vicinity of the bonding pad base, wherein the buried patterned conductor path layer includes at least one conductor path which extends between the bonding pad base and the sensor base and which further extends below the bonding pad base and the sensor base.

5. The bonding pad structure according to claim 4, wherein the protective layer is provided on the electrically insulating sacrificial layer, the protective layer covering the at least one conductor path of the buried patterned conductor path layer between the bonding pad base and the sensor base.

6. The bonding pad structure according to claim 1, wherein the protective layer has electrically insulating properties, the protective layer being resistant to an etching medium which is used to etch the electrically insulating sacrificial layer.

7. The bonding pad structure according to claim 1, wherein the substrate is a silicon substrate, and wherein the electrically insulating sacrificial layer is composed of silicon oxide.

8. The bonding pad structure according to claim 7, wherein the protective layer has a particular layer which is composed of at least one of nitride, undoped intrinsic polysilicon and doped oxide.

9. The bonding pad structure according to claim 8, wherein the protective layer has a double layer which is composed of nitride and undoped intrinsic polysilicon.

10. The bonding pad structure according to claim 9, wherein a first layer of the double layer is a lower nitride layer having a thickness of 100 nm to 500 nm, and wherein a second layer of the double layer is an upper polysilicon layer having a thickness of 20 nm to 100 nm.

11. The bonding pad structure according to claim 9, wherein the protective layer has a further layer.

12. The bonding pad structure according to claim 11, wherein the further layer is composed of doped silicon oxide.

13. The bonding pad structure according to claim 1, further comprising:

a metallic bonding pad provided on the bonding pad base.

14. The bonding pad structure according to claim 13, wherein the metallic bonding pad is composed of one of aluminum and an aluminum alloy.

15. The bonding pad structure according to claim 1, wherein the bonding pad structure is provided for a micromechanical sensor.

16. A method for manufacturing a bonding pad structure, comprising the steps of:

preparing a substrate;

forming an electrically insulating sacrificial layer on the substrate, the electrically insulating sacrificial layer including a patterned conductor path layer which is buried in the electrically insulating sacrificial layer;

depositing a protective layer on the electrically insulating sacrificial layer;

patterning the protective layer;

forming a contact hole in the electrically insulating sacrificial layer;

forming a bonding pad base in the contact hole, the bonding pad base being composed of an electrically conductive material, the bonding pad base including a first region which extends over the sacrificial layer and a second region which extends through the contact hole, the second region contacting the patterned conductor path layer;

etching the sacrificial layer;

wherein the protective layer is at least temporarily provided on a particular region of the electrically insulating sacrificial layer, the particular region being beneath the bonding pad base and around the bonding pad base, the protective layer preventing the electrically insulating sacrificial layer from being underetched beneath the bonding pad base when the electrically insulating sacrificial layer is being etched such that at least one of the substrate and the patterned conductor path layer is exposed.

17. The method according to claim 16, further comprising the step of:

removing the protective layer after the electrically insulating sacrificial layer is etched.

18. The method according to claim 16, wherein the substrate is composed of silicon, and wherein the step of forming the electrically insulating sacrificial layer includes the substeps of:

oxidizing the substrate to form a first oxide layer, depositing and patterning the conductor path layer on the first oxide layer, and forming a second oxide layer on the patterned conductor path layer and the first oxide layer.

19. The method according to claim 18, wherein the step of forming the bonding pad base includes the substeps of:

depositing a polysilicon layer, depositing and patterning a bonding pad metal layer, and patterning the polysilicon layer to form the bonding pad base.

20. The method according to claim 19, wherein the polysilicon layer is deposited by epitaxy.

21. The method according to claim 20, further comprising the step of:

during the step of patterning the polysilicon layer, forming a sensor comb structure and a sensor base structure simultaneously with the bonding pad base.

22. The method according to claim 21, wherein the protective layer is at least partially removed in the particular region which is surrounded by the sensor base structure.

23. The method according to claim 21, further comprising the step of:

applying a sensor cap onto the sensor base structure.

24. The method according to claim 21, further comprising the step of:

during the step of etching the electrically insulating sacrificial layer, freely suspending the sensor comb structure.

* * * * *